United States Patent [19]

Colquhoun

[11] Patent Number: 4,753,899
[45] Date of Patent: Jun. 28, 1988

[54] PROCESS FOR THE FABRICATION OF A SCHOTTKY GATE FIELD-EFFECT TRANSISTOR HAVING A SUBMICRON EFFECTIVE CHANNEL LENGTH

[75] Inventor: Alexander Colquhoun, Heilbronn-Frankenbach, Fed. Rep. of Germany

[73] Assignee: Telefunken electronic GmbH, Heilbronn, Fed. Rep. of Germany

[21] Appl. No.: 3,709

[22] Filed: Jan. 15, 1987

[30] Foreign Application Priority Data

Jan. 28, 1986 [DE] Fed. Rep. of Germany ....... 3602461

[51] Int. Cl.[4] .................... H01L 21/265; H01L 21/44
[52] U.S. Cl. ..................................... 437/44; 437/176; 437/241; 437/912; 148/DIG. 139; 148/DIG. 140; 357/22 I; 357/23.3; 357/22
[58] Field of Search ............. 29/571, 576 B; 148/DIG. 139, DIG. 140; 357/22 I, 22 J, 23.3; 156/643; 437/241, 176, 44, 233, 184, 912

[56] References Cited

U.S. PATENT DOCUMENTS

| | | | |
|---|---|---|---|
| 4,093,503 | 6/1978 | Harris et al. .......................... | 156/643 |
| 4,338,616 | 7/1982 | Bol ...................................... | 29/571 |
| 4,354,896 | 10/1982 | Hunter et al. ........................ | 156/643 |
| 4,358,340 | 11/1982 | Fu ........................................ | 156/643 |
| 4,419,809 | 12/1983 | Riseman et al. ...................... | 29/571 |
| 4,430,791 | 2/1984 | Dockerty ............................ | 29/576 B |
| 4,445,267 | 5/1984 | De La Moneda et al. ........... | 29/591 |
| 4,587,709 | 5/1986 | Fowler et al. ...................... | 357/23.3 |
| 4,645,563 | 2/1987 | Terada ................................ | 156/643 |
| 4,648,937 | 3/1987 | Ogura et al. ........................ | 156/643 |

FOREIGN PATENT DOCUMENTS 3535002 4/1987 Fed. Rep. of Germany .
231175A 12/1985 German Democratic Rep. .

OTHER PUBLICATIONS

"Submicron-Gate Self-Aligned Gallium Arsenide FET Fabrication", (anon.), IBM Technical Disclosure Bulletin, vol. 28, No. 6, Nov. 1985, pp. 2687-2690.
Johnson et al., "Method for Making Submicron Dimensions in Structures Using Sidewall Image Transfer Techniques," IBM Technical Disclosure Bulletin, vol. 26, No. 9, Feb. 1984, pp. 4587-4589.
Jackson et al., "A Novel Submicron Fabrication Technique," IEDM 1979 Conference Volume, pp. 58-61.
Ipri et al., "Submicrometer Polysilicon Gate CMOS/SOS Technology", IEEE Transactions on Electron Devices, vol. ED-27, No. 7, Jul. 1980, pp. 1275-1279.
Hunter et al., "A New Edge-Defined Approach for Submicrometer MOSFET Fabrication," IEEE Device Letters, vol. EDL-2, No. 1, Jan. 1981, pp. 4-6.
Rode et al., "Gallium Arsenide Digital IC Processing-A Manufacturing Perspective", Solid State Technology, Feb. 1985, pp. 209-215.
Ghandhi, VLSI Fabrication Principles, John Wiley and Sons, Inc., 1983, pp. 495-496.

Primary Examiner—Aaron Weisstuch
Assistant Examiner—Mary Wilczewski
Attorney, Agent, or Firm—Spencer & Frank

[57] ABSTRACT

The invention relates to a process for the fabrication of a field-effect transistor as described in German Patent Application No. P 35 35 002.4, corresponding to U.S. application Ser. No. 06/914,540 comprises first covering a semiconductor member with a layer which forms the channel region and part of which is covered with a passivation layer. Impurities are implanted into the exposed regions of the semiconductor surface and form underneath the channel region highly doped source and drain regions. A surface layer of the passivation layer is then removed in a section adjacent to the source region and a gate electrode is formed on the thus exposed narrow area of the channel region.

17 Claims, 5 Drawing Sheets

PROCESS FOR THE FABRICATION OF A SCHOTTKY GATE FIELD-EFFECT TRANSISTOR HAVING A SUBMICRON EFFECTIVE CHANNEL LENGTH

BACKGROUND OF THE INVENTION

The invention relates to a process for the fabrication of a field-effect transistor comprising a semiconductor substrate with a drain region, a source region and a gate electrode for influencing a channel region. The source region and the gate electrode are so arranged in superimposed relation to each other in a projection onto the channel plane that the effective channel length becomes so small that an increase in the electron velocity in the channel is attained. Such a field-effect transistor is described in the older German Patent Application No. P 35 35 002.4, corresponding to U.S. application Ser. No. 06/914,540. In this field-effect transistor it is, above all, a question of substantially improving the high frequency characteristics, the limiting frequency and the noise behaviour of the field-effect transistor by a reduction in the effective gate length. In this case, the fact that extremely short channel lengths result in a strong increase in the saturation velocity of the electrons in the active channel is exploited. This interrelation is described in the older Patent Application.

The channel length in the aforementioned field-effect transistor is, therefore, preferably below 0.5 $\mu$m. The desired value of the channel length is solely dependent on the alignment accuracy of the technology employed, with this alignment accuracy being <0.1 $\mu$m. The very small effective channel lengths are attained by the gate electrode slightly overlapping the source region in the projection onto the channel plane in the direction of the drain region. It is also possible for the edge of the gate electrode that faces the drain region to coincide in the projection onto the channel plane with the outer edge of the source region that faces the drain region. In this case, the extension of the space-charge zone from the edge of the source region in the direction of the drain region is exploited.

SUMMARY OF THE INVENTION

The purose underlying the invention is to indicate suitable process technologies with which the desired structure of the field-effect transistor can be particularly well realized. This object is attained in accordance with the invention in a field-effect transistor of the kind described at the outset by the semiconductor substrate first being covered with a layer forming the channel region, by part of the channel region being covered with a passivation layer and impurities being implanted into the exposed regions of the semiconductor surface to form underneath the channel region highly doped source and drain regions, by a surface layer of the passivation layer then being removed in the section adjacent to the source region and a gate electrode being arranged on the thus exposed narrow area of the channel region.

The passivation layer must prevent the implantation ions from reaching the semiconductor substrate and preferably consists of silicon nitride. This passivation layer is subjected to controlled etching, and the aforementioned surface layer is removed in both the vertical and horizontal directions. Above the channel region, between the source and drain regions, a narrow area outside of the source zone is thus created by the horizontal removal and the effective channel length is substantially determined by its width.

Further advantageous embodiments are apparent from the subclaims.

BRIEF DESCRIPTION OF THE DRAWINGS

The invention will now be explained in greater detail with reference to embodiments.

PREFERRED EMBODIMENTS OF THE INVENTION

Figure 1A:
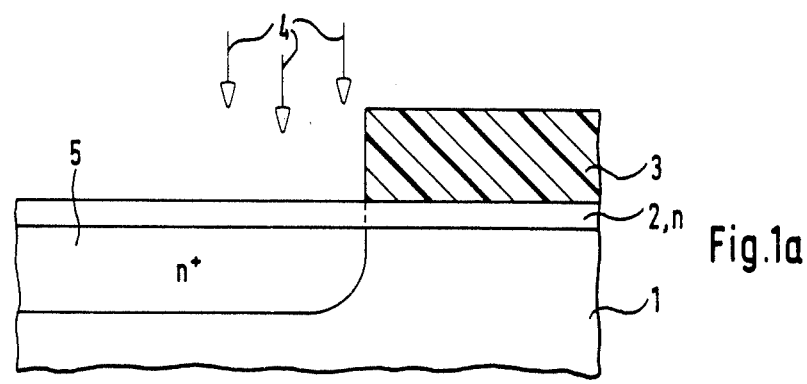
FIGS. 1a to 1d are cross-sectional views of various fabrication stages, with only the section of the fieldeffect transistor that includes the source region and the gate electrode being illustrated in each case.

In accordance with FIG. 1a, a semiconductor layer 2 which is n-doped and has, for example, a thickness of 0.05 to 0.2 $\mu$m is deposited on a high-resistivity base member 1 consisting, for example, of gallium arsenide. The impurity concentration of this layer 2 which forms the channel region, is approximately $10^{17}$ atoms/cm$^3$. The layer 2 may be fabricated on the semiconductor base member 1 by implantation or by epitaxy. A passivation layer 3 consisting, for example, of silicon nitride is deposited on a section of the n-type conductive channel layer 2 and prevents penetration of implantated ions into the channel region portion of layer 2 located thereunder. Ions 4 are then implanted into the exposed parts of the semiconductor arrangement and penetrate the channel region forming layer 2 to form in the region located thereunder highly doped n$^+$-type conductive source regions 5 and drain regions, respectively. In this case, the effect that in the implantation of impurities, the concentration maximum can be shifted into the interior of the semiconductor member is exploited. This is apparent for example, from FIG. 3.

Figure 3:
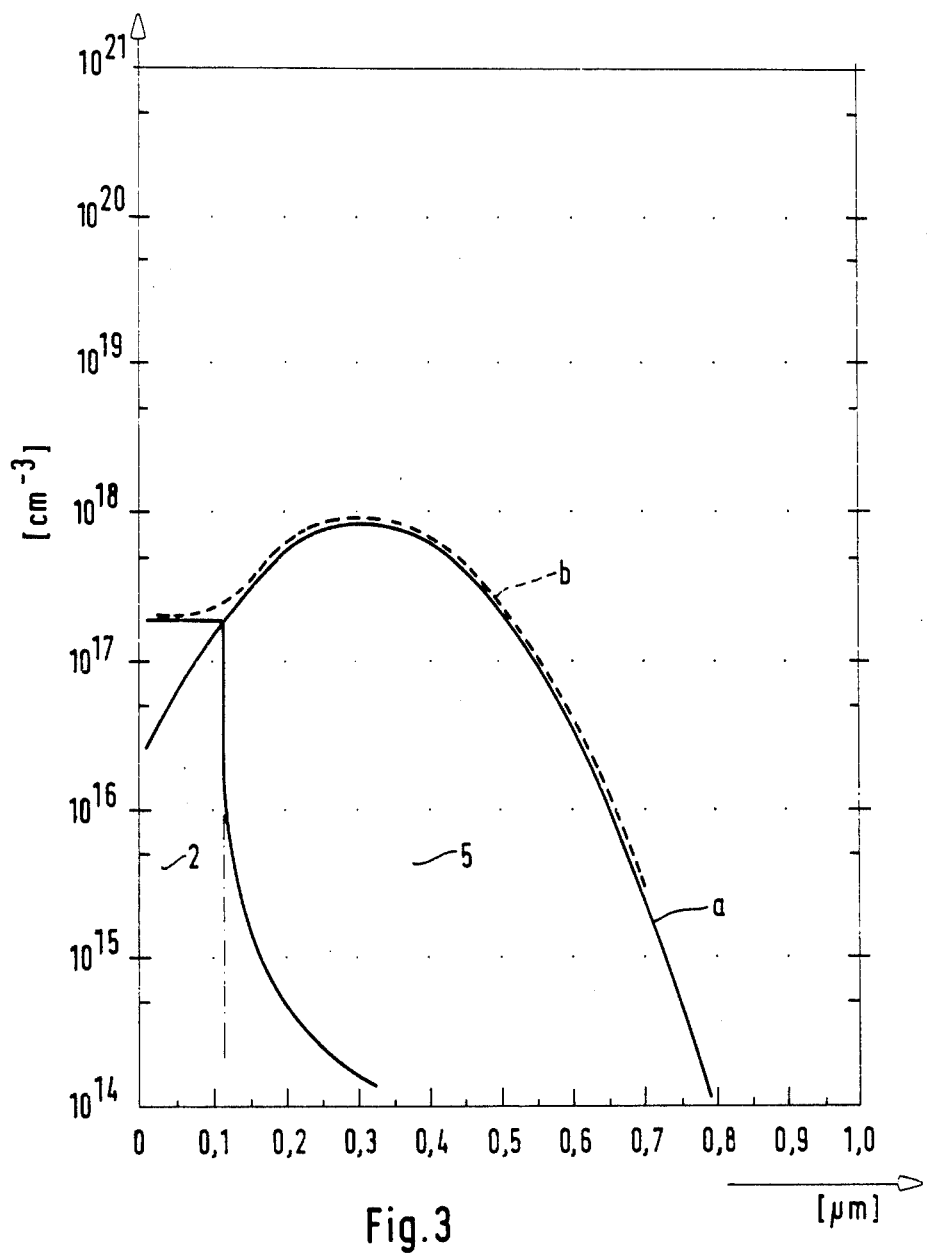
FIG. 3 shows the impurity concentration profile of the channel zone and of the source and drain regions.

In accordance with FIG. 3, the layer 2 forming the channel region has, for example, a thickness of 0.1 $\mu$m and an impurity concentration of approximately $10^{17}$ atoms/cm$^3$. The solid line a shows the implantation profile in the implantation of silicon ions in a gallium arsenide semiconductor member. The concentration maximum is to be found at approximately 0.3 to 0.4 $\mu$m depth and is approximately $10^{18}$ atoms/cm$^3$. The curve b represented by a dashed line shows the impurity profile after ion implantation, which is formed by the combination of the impurity concentration in the channel region forming layer 2 and the implantation profile a. After implantation, the impurities are activated by annealing and a very rapid annealing process is preferred in order to prevent considerable diffusion of the charge carriers out of the implantation region. Such a rapid annealing process is, for example, heat treatment using lamps.

Figure 1B:
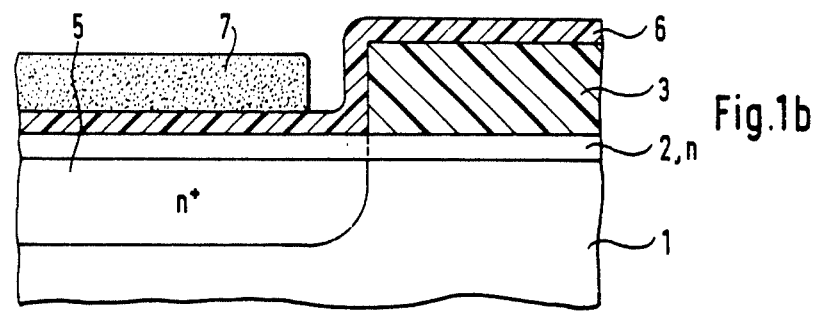
Figure 1C:
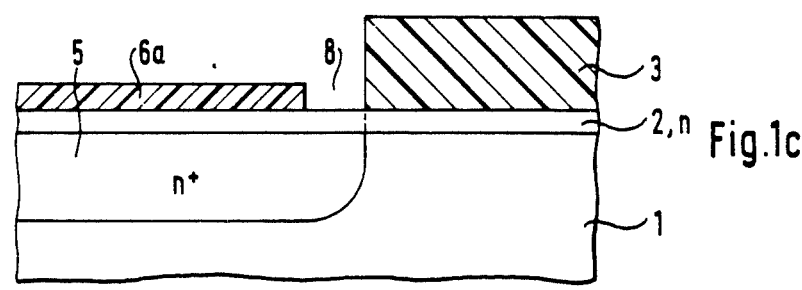

In accordance with FIG. 1b, a further passivation layer 6 consisting, for example, of silicon dioxide is then deposited on the semiconductor arrangement. This SiO$_2$ layer 6 is covered with a photoresist layer 7 which terminates at a defined distance from the edge of the silicon nitride layer 3. This distance between the photoresist layer 7 and the passivation layer 3 determines the gate metallization length Lg1 in accordance with FIG. 2. The silicon dioxide layer 6 is removed again in the regions not covered by photoresist 7, which results in the structure shown in FIG. 1c. Arranged on part of the source region 5 is a passivation layer 6a which terminates at a distance from the passivation layer 3. The exposed part 8 of the semiconductor surface between the two passivation layers 3 and 6a is covered by the gate electrode after an etching step which has yet to be carried out.

Figure 1D:
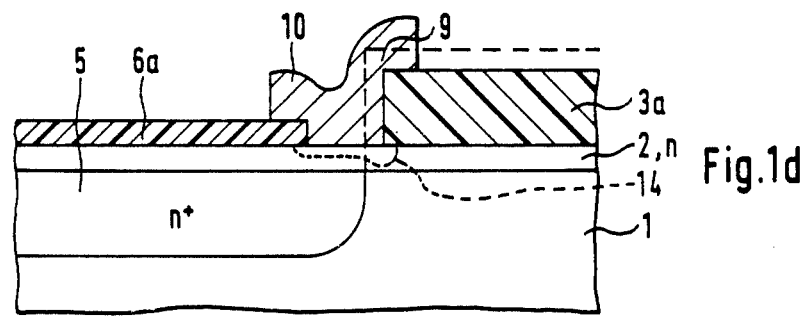

In the etching procedure, a surface layer 9 of the passivation layer 3 is removed by controlled etching. The passivation layer 3 is etched in both the vertical and the horizontal direction, as is indicated by a dashed line in FIG. 1d. The dashed line shows the original extent of the passivation layer 3 which is reduced on all sides by the controlled etching and is now designated by reference numeral 3a. The receding of the passivation layer 3 in the horizontal direction—caused by the vertical etching attack—results in exposure of part of the channel layer 2 which is not above the highly doped layer 5 and it can thus form a short effective channel. In this part of the layer 2 forming the channel, a space-charge zone 14, by means of which the channel can be fully or partly pinched-off, can be formed in the operating state. The gate electrode 10 which forms a Schottky contact with the layer 2 is required to produce the space-charge zone. The metallic Schottky contact 10 preferably extends onto the two passivation layers 6a and 3a.

Figure 2:
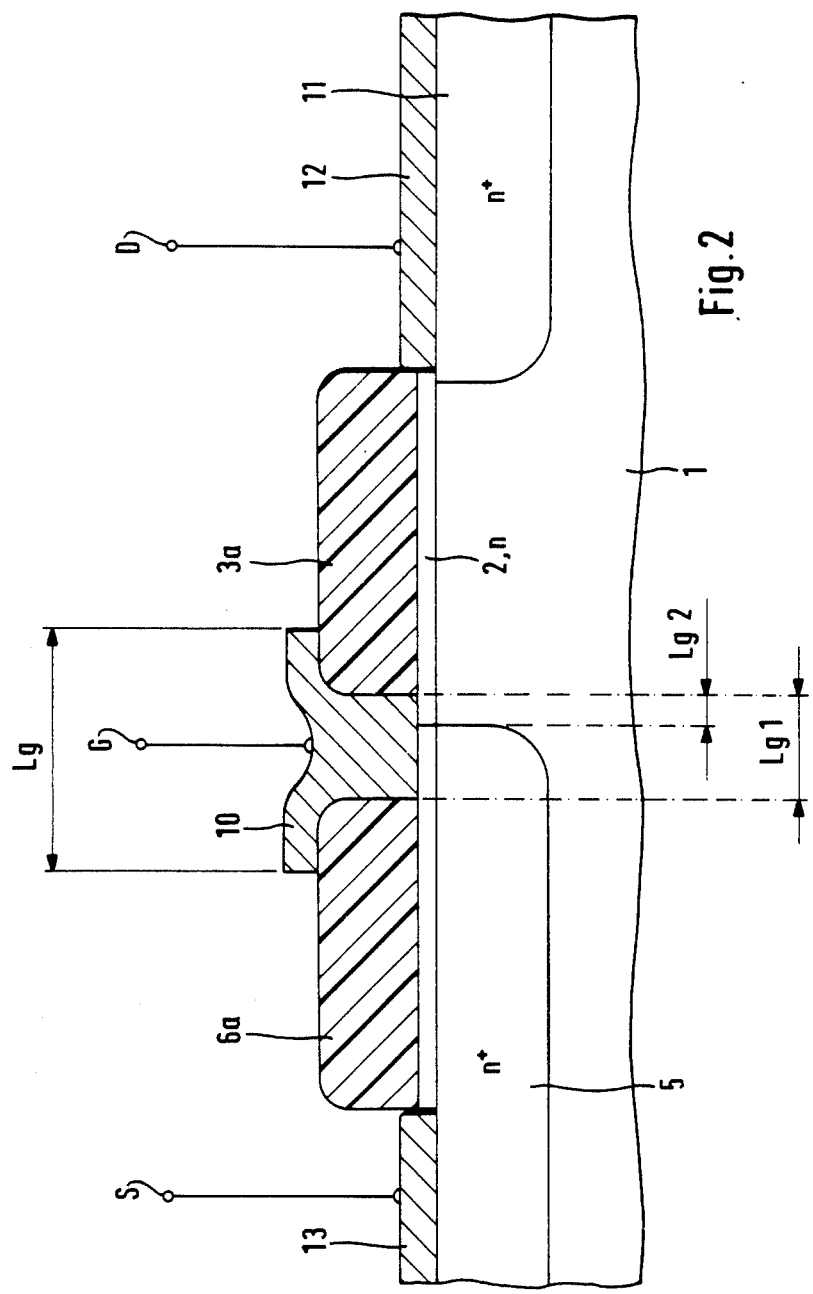
FIG. 2 is a cross-sectional view of the completed field-effect transistor.

The basic structure of the thus fabricated field-effect transistor is apparent from FIG. 2. It consists of the source region 5 and the drain region 11, with terminal contacts 13 and 12 as source contact and drain contact, respectively, mounted thereon. The area between the source region 5 and the drain region 11 is substantially covered by the passivation layer 3 which terminates at a short distance Lg2 in front of the source region 5. The gate contact 10 with the effective gate metallization length Lg1 extends, on the one hand, onto the passivation layer 3a and, on the other hand, onto the previously mentioned passivation layer 6a. The field-effect transistor according to the invention is produced by a self-aligning procedure and the effective channel length Lg2 can be extremely precisely determined merely by a controlled etching procedure. The thickness of the surface layer 9 which is removed by this controlled etching procedure will preferably be between 0.01 and 0.5 $\mu$m, and any desired dimension can be produced by the duration of the etching procedure. The original thickness of the silicon nitride layer 3 will, therefore, be substantially greater than the thickness of the surface layer which is to be removed. In one embodiment, the layer 3 has a thickness of approximately 1 $\mu$m.

Figure 4A:
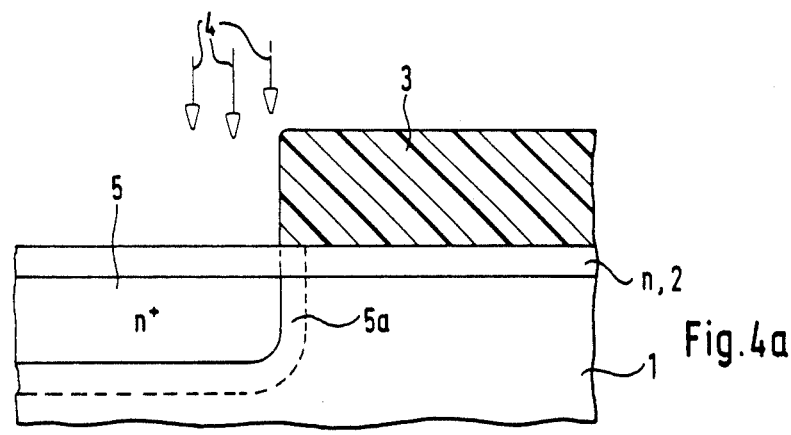
FIGS. 4a to 4c show various fabrication phases of the field-effect transistor where an isolation area is produced by a second implantation.

The transistor structure in the source region after implantation of the ions 4 forming the source region 5 is illustrated again in FIG. 4a. The activation of the implanted ions consisting, for example, of silicon necessitates an annealing process which, depending on the type of annealing process, involves an out-diffusion of the implanted charge carriers. This is exploited in the fabrication variant illustrated in FIGS. 4a to 4d to produce a self-aligned isolation zone in the source region 5. As is apparent from FIG. 4a, the charge carriers diffuse on all sides out of the source region 5 during the curing process and form an expansion 5a which also extends underneath the passivation layer 3. The thickness of this out-diffusion area 5a is, for example, 0.1 $\mu$m.

Figure 4B:
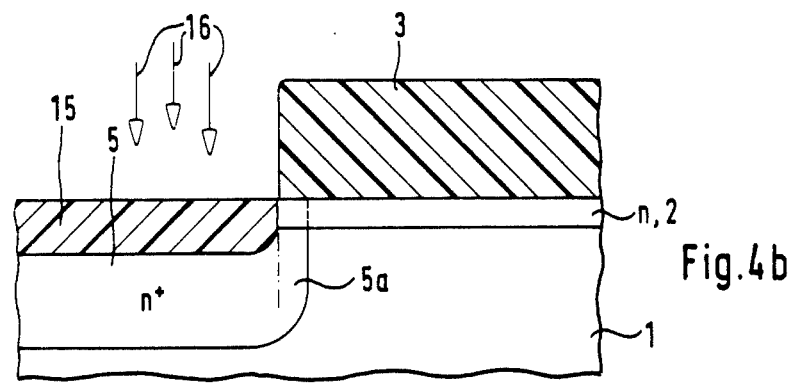
Figure 4C:
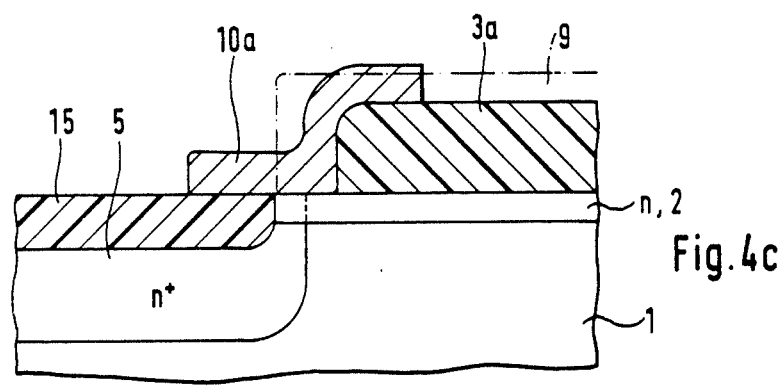
Figure 4D:
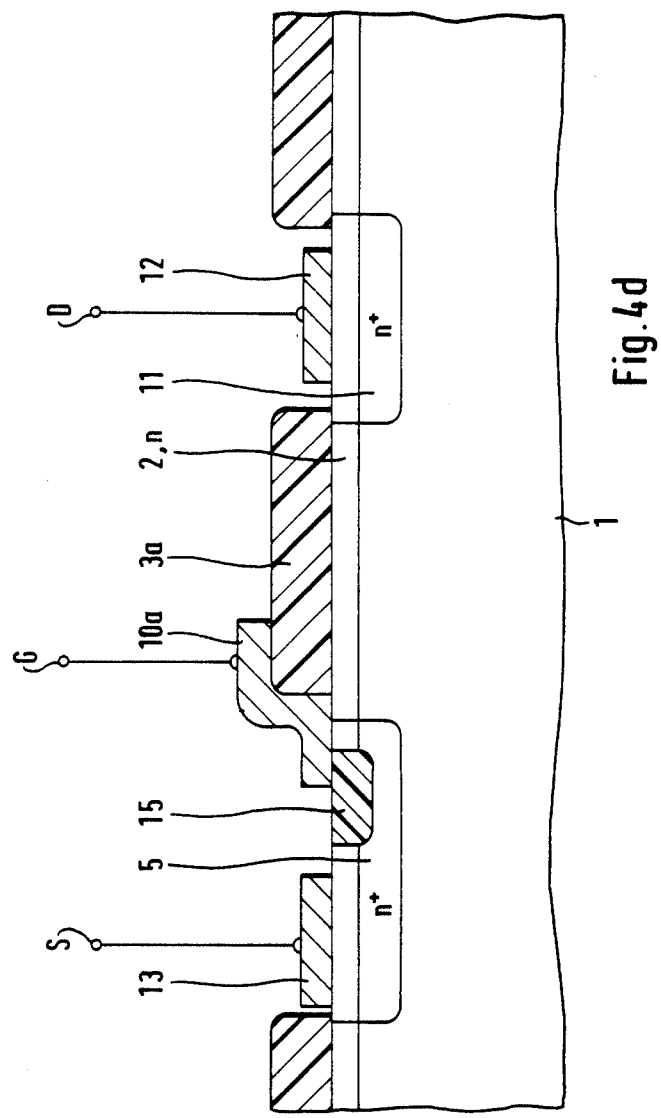
FIG. 4d is a cross-sectional view of the thus fabricated field-effect transistor.

In accordance with FIG. 4b, the passivation layer 3 is now used as mask for a further implantation process, in which ions are implanted into part of the source region 5 where they form an isoltion zone 15. With a gallium arsenide base member 1, the implanted ions 16, therefore, consist, for example, of boron, oxygen or hydrogen. The thus produced isolation zone 15 in the illustrated embodiment is somewhat thicker than the layer 2 forming the channel region.

After this second implantation process, a surface layer 9 of the passivation layer 3 is removed in the above-explained manner by controlled etching so that the channel layer 2 is exposed in a narrow region which determines the effective channel length Lg2. The gate electrode 10a consisting of a Schottky metal contact extends, on the one hand, onto the isolation area 15 and, on the other hand, onto the passivation layer 3a so that the effective gate metallization length on the semiconductor surface remains very small and the input capacitance of the transistor is extremely low. The thus fabricated, complete field-effect transistor structure is apparent from FIG. 4d. An isolation zone 15, onto which the gate Schottky electrode 10a extends, is located in the source region 5 at a short distance from the outer edge of the highly doped area that faces the drain region. The narrow effective channel region has been produced by the controlled etching of the passivation layer 3, onto whose remainder 3a the gate electrode 10a similarly extends. The source region 5 and the drain region 11 are each provided with one metallic ohmic connecting electrode 13 and 12, respectively. The remaining areas of the semiconductor surface are similarly covered with a passivation layer consisting of silicon dioxide or of silicon nitride.

What is claimed is:

1. Process for the fabrication of a barrier-layer field-effect transistor comprising a semiconductor substrate with a drain region, a source region and a gate electrode for influencing a channel region, the source region and the gate electrode being so arranged in superimposed relation to each other in the projection onto the channel plane that the effective channel length becomes so small that an increase in the electron velocity in the channel is attained, wherein the semiconductor substrate (1) is first covered with a layer (2) forming the channel region, part of the channel region forming layer is covered with a passivation layer (3) and impurities are implanted into the exposed regions of the semiconductor surface to form highly doped source and drain regions (5, 11) underneath the channel region forming layer wherein a surface layer (9) of the passivation layer (3) is then vertically and horizontally removed in the section adjacent to teh source region (5) with the thickness of the vertically removed portion of the passivation layer determining the effective channel length (Lg2) and a Schottky gate electrode (10) is arranged on the thus exposed narrow area of the channel region.

2. Process as defined in claim 1, wherein silicon nitride is used as the passivation layer (3).

3. Process as defined in claim 1, wherein an n-type conductive layer (2) forming the channel region with a thickness of approximately 0.1 to 0.2 $\mu$m and an impurity concentration of approximately $10^{17}$ atoms/cm$^3$ is used, and wherein the implanted, n+-type conductive source and drain regions (5, 11) underneath the layer (2)

forming the channel region have an impurity concentration of approximately $10^{18}$ to $10^{19}$ atoms/cm$^3$.

4. Process as defined in claim 3, wherein III/V compound material, in particular, gallium arsenide is used as the semiconductor material, and silicon ions are implanted to form the n+-type conductive source and drain regions (5, 11).

5. Process as defined in claim 1, wherein the passivation layer (3) is subjected to controlled etching for vertical and horizontal removal of said surface layer (9) with a thickness of approximately 0.01 to 0.5 μm.

6. Process as defined in claim 5, wherein prior to the controlled etching, a part of the channel forming layer overlying the source region (5) and spaced from said passivation layer is provided with a passivating cover layer (6a) so that the distance remaining between this cover layer (6a) and the passivation layer (3) which is subjected to controlled etching determines the gate metallization length (Lg1) upon completion of the etching procedure.

7. Process as defined in claim 6, wherein silicon dioxide is used as said cover layer (6a).

8. Process as defined in claim 1, wherein after implantation of the ions forming impurities, an annealing process is performed to activate the impurities, and the source region is expanded slightly underneath the passivation layer (3) by out-diffusion, wherein ions which convert a limited surface layer (15) of the source region (5) into an isolation zone are then implanted, wherein after this implantation process the passivation layer (3) is subjected to controlled etching, and wherein, finally, the gate electrode (10a) is mounted and the distance between the isolation zone (15) and the passivation layer (3a) which has been subjected to controlled etching determines the gate metallization length (Lg1).

9. Process as defined in claim 8, wherein boron, oxygen or hydrogen ions are implanted to produce the isolation zone (15).

10. Process for the production of a barrier-layer field-effect transistor including a semiconductor body with a drain region, a source region, and a gate electrode for influencing a channel region extending between the source and drain regions, and with the source region and gate electrode being arranged in superimposed relation to each other in projection onto the channel plane so that the effective channel length becomes so small that an increase in electron velocity in the channel is achieved; said method comprising the steps of: covering the semiconductor body with a channel region forming semiconductor layer; covering that part of said semiconductor layer which is to constitute the channel region with a passivation layer; implanting impurities into the exposed regions of the surface of said semiconductor layer to form highly doped source and drain regions below said semiconductor layer; vertically and horizontally removing a surface layer of a thickness of about 0.01 to 0.5 μm from said passivation layer in the region adjacent said source region to expose a narrow area of the channel region corresponding to the thickness of the vertical removal; and forming a Schottky gate contact on said exposed narrow area of said channel region, whereby the thickness of the vertical removal of said passivation layer determines the effective channel length (Lg2) of said gate electrode.

11. A process as defined in claim 10 wherein said passivation layer is formed of silicon nitride.

12. A process as defined in claim 10 further comprising: prior to said step of removing, forming an insulating region at a portion of the surface of said semiconductor layer overlying said source region, with said insulating region being spaced from said passivation layer so that the distance between said insulating region and said passivation layer after said step of removing determines the gate metallization length of said Schottky gate contact.

13. A process as defined in claim 12 wherein: said step of forming an insulating region includes applying a passivation cover layer to a portion of the surface of said semiconductor layer; and said gate electrode is applied to the exposed semiconductor surface between said passivation layer and said cover layer.

14. A process as defined in claim 13 wherein said cover layer is formed of silicon dioxide.

15. A process as defined in claim 14 wherein said passivation layer is formed of silicon nitride.

16. A process as defined in claim 12 further comprising after said step of implanting and annealing said semiconductor body to activate the implanted impurities and cause the source region to exand slightly underneath said passivation layer by out diffusion, and converting a limited surface layer of the source region adjacent said passivation layer into an isolation region by implantation of further ions; and wherein said gate control is applied to said exposed narrow area of said channel region and the exposed surface area of said source region which extended under said passivation region.

17. A process as defined in claim 16 wherein said semiconductor body is formed of gallium arsenide and wherein said further ions are boron, oxygen or hydrogen ions.

* * * * *